United States Patent [19]

Kobayashi et al.

[11] 4,449,769
[45] May 22, 1984

[54] SUBSTRATE FOR MOUNTING ELECTRIC PARTS

[75] Inventors: Mikio Kobayashi; Kingo Kuritani, both of Furukawa, Japan

[73] Assignee: Alps Electric Co., Ltd., Tokyo, Japan

[21] Appl. No.: 387,497

[22] Filed: Jun. 11, 1982

Related U.S. Application Data

[63] Continuation of Ser. No. 138,653, Apr. 8, 1980, abandoned.

[30] Foreign Application Priority Data

Apr. 11, 1979 [JP] Japan .................................. 54-43795

[51] Int. Cl.³ .............................................. H05K 1/18
[52] U.S. Cl. ...................................... 339/17 C; 29/832; 361/414
[58] Field of Search ................. 339/17 R, 17 C, 18 R, 339/18 B, 18 P, 17 E, 17 T; 361/401, 414, 400, 403, 406; 29/832, 837–839

[56] References Cited

U.S. PATENT DOCUMENTS

| | | | |
|---|---|---|---|
| 2,982,883 | 5/1961 | Gordy | 339/17 C |
| 3,149,265 | 9/1964 | Thorn | 361/414 |
| 3,228,091 | 1/1966 | Rice | 339/17 C |
| 4,095,866 | 6/1978 | Merrill | 361/414 |
| 4,242,720 | 12/1980 | Moore | 361/414 |

FOREIGN PATENT DOCUMENTS 53-122662 9/1978 Japan .

*Primary Examiner*—Neil Abrams
*Attorney, Agent, or Firm*—Guy W. Shoup; Gerard F. Dunne

[57] ABSTRACT

Two substrates carrying printed circuit patterns are coupled together back-to-back with an adhesive tape interposed therebetween. A plurality of holes are formed through the substrates, and apertures of small diameter are punched in the portions of the adhesive tape backing these holes. Electric components to be held to the substrate are then inserted through the holes punched in the adhesive tape and soldered firmly into portion by an automatic soldering apparatus.

3 Claims, 5 Drawing Figures

SUBSTRATE FOR MOUNTING ELECTRIC PARTS

This application is a continuation of application Ser. No. 138,653 filed Apr. 8, 1980 and now abandoned.

BACKGROUND OF THE INVENTION

The present invention relates to a printed substrate able to hold electric parts, and more specifically, to a substrate having wiring patterns formed on both surfaces thereof.

According to the conventional art of this field, small electric parts are arrayed on a plane of a printed substrate which has wiring patterns on one surface only, making it difficult to obtain a sufficient reduction in size. Further, small electric parts must be temporarily secured to the printed substrate by using a bonding agent or the like so that they can be soldered in a subsequent soldering step by an automatic soldering apparatus. Therefore, time consuming and troublesome operations were required for applying the bonding agent.

SUMMARY OF THE INVENTION

The object of the present invention is to provide a substrate for mounting electric parts, which letter takes up space.

Another object of the present invention is to provide a substrate for mounting electric parts, which is capable of temporarily holding the electric parts when they are inserted into the substrate.

A further object of the present invention is to provide a substrate which can receive and hold electric parts in a fully automated process.

To accomplish the above-mentioned objects according to the present invention, two substrates are coupled together at their backs by placing a double-coated adhesive tape therebetween. Holes for inserting electric parts are formed in the two substrates, and small apertures a diameter smaller than those of the electric parts are formed in the adhesive tape in the holes. Further objects and advantages of the present invention will become apparent from the following description in in conjunction with the accompanying drawings.

DESCRIPTION OF THE PREFERRED EMBODIMENT

Figure 1:
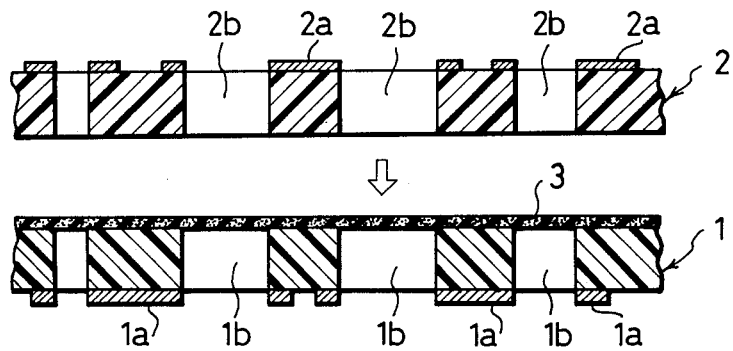
FIG. 1 is a cross-sectional view showing the state in which a first substrate and a second substrate for mounting the electric parts according to the present invention have not yet been joined together.
Figure 2:
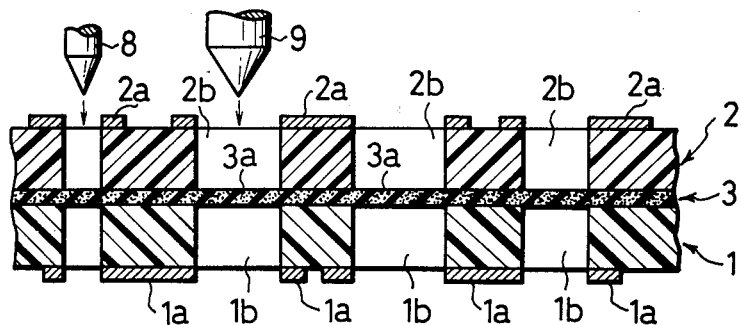
FIG. 2 is a cross-sectional view of the substrate for mounting the electronic parts.
Figure 3:
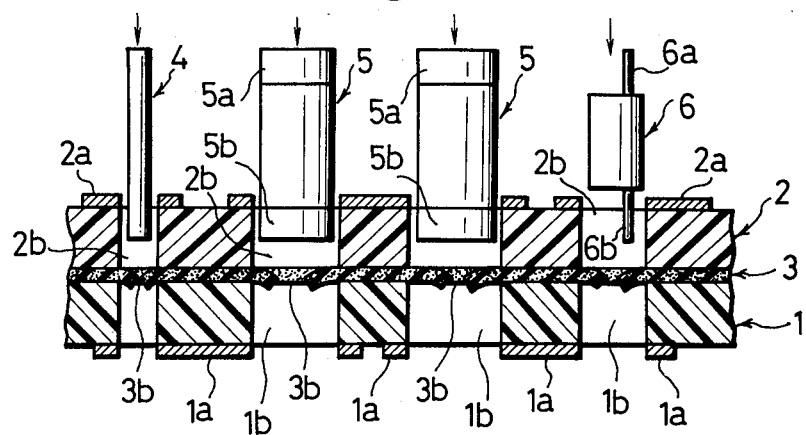
FIG. 3 is a cross-sectional view showing the state in which the electric parts are being inserted in the substrate.
Figure 4:
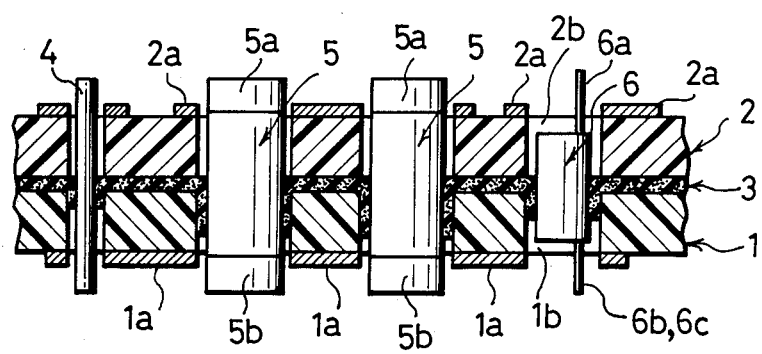
FIG. 4 is a cross-sectional view showing the state in which the electric parts have been inserted in the substrate.
Figure 5:
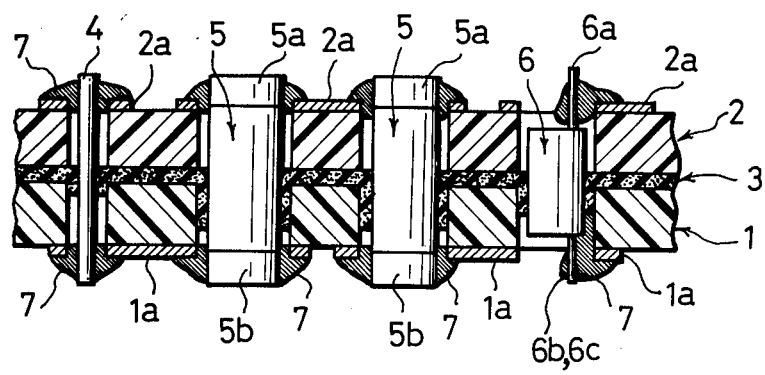
FIG. 5 is a cross-sectional view of the substrate for mounting electric parts according to the present invention, in which the electric parts have been inserted and soldered.

An embodiment of the present invention is illustrated below with reference to the drawings, in which reference numeral 1 denotes a substrate having wiring patterns 1a formed on one surface thereof, as well as a plurality of holes 1b in which will be inserted electric parts that will be mentioned later. Reference numeral 2 denotes a substrate having wiring patterns 2a formed on one surface thereof, as well as a plurality of holes 2b at positions corresponding to the holes 1b of the substrate 1. Reference numeral 3 denotes a sheet-like adhesive tape which is coated with an adhesive on both surfaces thereof. The double-coated adgesive tape 3 is interposed between the substrate 1 and the substrate 2 so that the three members are adhered together as a unitary structure. Punches 8 and 9 are then inserted into the holes of the double substrate, as shown in FIG. 2, in order to cut those portions 3a of the adhesive tape 3 which are located in the holes of the double substrate. In this way, apertures 3b of a diameter slightly smaller than the diameter of the holes 2b may be formed. Alternatively, the punches may perforate the portions 3a to weaken them, or provide longitudinal slits or merely score the portions 3a by providing grooves or the like. Reference numeral 4 denotes a lead wire composed of a metal rod, and 5 denotes a cylindrical chip capacitor having electrodes 5a and 5b at respective ends thereof. Reference numeral 6 denotes a small molded transistor of which the outer side is packaged by molding, and which has lead wires 6a, 6b and 6c that extend in two directions. When these electric parts, i.e., when the lead wire 4, the chip capacitor 5 and the small molded transistor 6 are inserted into the predetermined holes 2b of the substrate 2 from a vertical direction as shown in FIG. 3, the ends on one side of the electric parts come into contact with the double-coated tape 3. In this case, since the tape 3 has been cut or perforated, the electric parts are allowed to move downwardly to fold the adhesive tape 3 downwardly as shown in FIG. 4, whereby the electric parts are temporarily fastened to the substrate owing to the adhesive force of the adhesive tape 3 and do not come off even if vibrated slightly. With the electric parts being inserted as shown in FIG. 4, the electrodes 5a, 5b, and lead wires 6a, 6b, 6c of the electric parts are soldered as denoted by 7 to the wiring patterns 1a, 2a formed on both sides of the substrate by using an automatic soldering apparatus so that they are electrically connected, as shown in FIG. 5.

As mentioned in the foregoing, the substrate for mounting electric parts of the present invention consists of two substrates and a piece of a double-coated adhesive tape which bonds the two pieces of substrate together. Therefore, no particular fastening means is necessary, and the double-coated adhesibe tape serves as a cushioning agent when the substrates are slightly deformed by heating or the like. Moreover, the electric parts inserted in the holes of the substrate are temporarily held by the adhesion force of the double-coated adhesive tape, lending themselves well for automatic soldering. Further, since the electric parts are all inserted in the vertical direction, it is possible to assemble them automatically. Furthermore, provision of wiring patterns on both surfaces enables the substrate to be markedly reduced in size as compared with the conventional substrates having electric parts which are arrayed on one surface only.

What is claimed is:

1. A two-sided printed circuit board comprising first and second substrates arranged back-to-back with printed circuit patterns being formed on their respective outer faces, said substrates having aligned openings defining passageways through said circuit board for receiving portions of electric components to be soldered to said circuit patterns, said passageways each being wider than its component portion adapted to be received therein to enable said portions to be fitted easily within said passageways, and means including a tape having adhesive material on each side interposed between said substrates and extending at least partially across said passageways for holding said substrates together while providing portions of adhesive tape within said passageways that can be deflected along wall portions of said passageways upon insertion of said components thereinto for holding electric components therewithin during soldering of said components to said circuit patterns, the portions of said tape deflected along said wall being substantially a full thickness thereof.

2. A two-sided printed circuit board according to claim 1, said adhesive tape extending completely across said passageway but being weakened in central areas therewithin to enable said electric components to be inserted in said passageways.

3. A method of assembling electric components to a printed circuit board having circuit patterns on each face thereof, including:
forming said circuit board by placing two substrates each adapted to have circuit patterns on their respective outer faces in back-to-back relation with a flexible tape having adhesive material on each side being placed therebetween, said substrate having aligned openings defining passageways through said circuit board for receiving portions of said electric components, said passageways each being wider than its component portion received therein to enable said portions to be fitted easily within the passageways, said flexible tape extending at least partially across said passageways;
inserting at least portions of said electric components into respective ones of said passageways and holding said components therewithin by portions of said flexible tape having substantially a full thickness thereof deflected along wall portions of said passageways upon insertion of said components thereinto; and
soldering said components to said circuit patterns.

* * * * *